(12) United States Patent
Kishimoto

(10) Patent No.: US 10,340,456 B2
(45) Date of Patent: Jul. 2, 2019

(54) VAPOR DEPOSITION METHOD WITH ELECTROMAGNETS GENERATING MAGNETIC FIELD IN REVERSE ORIENTATION

(71) Applicant: Sakai Display Products Corporation, Osaka (JP)

(72) Inventor: Katsuhiko Kishimoto, Osaka (JP)

(73) Assignee: Sakai Display Products Corporation, Osaka (JP)

( * ) Notice: Subject to any disclaimer, the term of this patent is extended or adjusted under 35 U.S.C. 154(b) by 0 days.

(21) Appl. No.: 15/757,263

(22) PCT Filed: Apr. 12, 2017

(86) PCT No.: PCT/JP2017/014996
§ 371 (c)(1),
(2) Date: Jun. 27, 2018

(87) PCT Pub. No.: WO2018/189833
PCT Pub. Date: Oct. 18, 2018

(65) Prior Publication Data
US 2019/0067582 A1 Feb. 28, 2019

(51) Int. Cl.
*H01L 51/00* (2006.01)
*H01L 27/32* (2006.01)
(Continued)

(52) U.S. Cl.
CPC ........ *H01L 51/0012* (2013.01); *C23C 14/042* (2013.01); *C23C 14/12* (2013.01);
(Continued)

(58) Field of Classification Search
None
See application file for complete search history.

(56) References Cited

U.S. PATENT DOCUMENTS

2009/0286447 A1* 11/2009 Kobayashi ............ C23C 14/042
445/58
2010/0081355 A1 4/2010 Inoue et al.
(Continued)

FOREIGN PATENT DOCUMENTS

JP H10152776 A 6/1998
JP 2003187973 A 7/2003
(Continued)

OTHER PUBLICATIONS

English Translation of International Search Report, PCT Application No. PCT/JP2017/014996, Japan Patent Office. dated Jun. 20, 2017.

*Primary Examiner* — Lex H Malsawma
(74) *Attorney, Agent, or Firm* — Marsh Fischmann & Breyfogle LLP

(57) ABSTRACT

A vapor deposition apparatus is configured to attract a vapor deposition mask by an electromagnet. The electromagnet includes a first electromagnet for generating a magnetic field in a first orientation, and a second electromagnet for generating a magnetic field in a second orientation, which is a reverse orientation to the first orientation. As a result, a generated magnetic field is weakened by operating the first and second electromagnets at the same time when a current is turned on, and an intended magnetic field can be obtained by thereafter turning off the second electromagnet. As a result, an influence of electromagnetic induction is reduced, reducing failure of elements and the like formed on a substrate for vapor deposition and degradation in properties of the elements. Meanwhile, by turning off the operation of the second electromagnet after the current is turned on, a normal attraction force can be obtained.

4 Claims, 5 Drawing Sheets

(51) Int. Cl.
    *C23C 14/04*     (2006.01)
    *C23C 14/12*     (2006.01)
    *C23C 14/24*     (2006.01)
    *C23C 14/50*     (2006.01)
    *H01L 51/56*     (2006.01)

(52) U.S. Cl.
    CPC .............. *C23C 14/24* (2013.01); *C23C 14/50* (2013.01); *H01L 27/3244* (2013.01); *H01L 51/001* (2013.01); *H01L 51/0011* (2013.01); *H01L 51/56* (2013.01); *H01L 2227/323* (2013.01)

(56) References Cited

U.S. PATENT DOCUMENTS

| | | | |
|---|---|---|---|
| 2010/0206222 A1* | 8/2010 | Sung | C23C 16/042 118/69 |
| 2015/0013599 A1* | 1/2015 | You | B05C 21/005 118/504 |

FOREIGN PATENT DOCUMENTS

| | | |
|---|---|---|
| JP | 2008024956 A | 2/2008 |
| JP | 2010106360 A | 5/2010 |
| WO | 2017154234 A1 | 9/2017 |

\* cited by examiner

VAPOR DEPOSITION METHOD WITH ELECTROMAGNETS GENERATING MAGNETIC FIELD IN REVERSE ORIENTATION

TECHNICAL FIELD

The present disclosure relates to a vapor deposition apparatus and a vapor deposition method for vapor-depositing, for example, organic layers of an organic EL display apparatus, and to a method of manufacturing an organic EL display apparatus.

BACKGROUND ART

For example, when manufacturing an organic EL display apparatus, driving elements such as TFTs are formed on a support substrate, and on electrodes provided on them, organic layers are deposited for each pixel. The organic layers are weak to water and cannot be etched. Therefore, the deposition of the organic layers is done by superposing a vapor deposition mask and the support substrate (substrate for vapor deposition) on each other, and by vapor-depositing an organic material through openings of the vapor deposition mask. By doing so, a required organic material is deposited only on the electrodes of required pixels. If the substrate for vapor deposition and the vapor deposition mask are not as close as possible to each other, organic layers are not formed only in a precise area of the pixels. If the organic material is not deposited only in a precise area of the pixels, a display image is likely to be unclear. Thus, a magnetic chuck is used which brings the substrate for vapor deposition and the vapor deposition mask close to each other by using a magnetic material for the vapor deposition mask, and by placing the substrate for vapor deposition between a permanent magnet or an electromagnet and the vapor deposition mask (for example, refer to Patent Document 1).

PRIOR ART DOCUMENT

Patent Document

JP 2008-024956 A

SUMMARY OF THE INVENTION

Problem to be Solved by the Invention

A metal mask is conventionally used as a vapor deposition mask. However, in recent years, there is a tendency that a hybrid-type vapor deposition mask is used which has a mask made of a resin layer having openings each with a periphery supported by a metal support layer in order to form finer openings. A vapor deposition mask with a smaller amount of magnetic material, such as the hybrid mask, cannot be sufficiently attracted unless a stronger magnetic field is used.

As described above, if the attraction is not sufficient, the closeness between the substrate for vapor deposition and the vapor deposition mask decreases. In order to sufficiently attract the vapor deposition mask to the substrate for vapor deposition, a strong magnetic field is required. If a permanent magnet is used as a magnet in the magnetic chuck, and if its magnetic field is strong, an alignment between the substrate for vapor deposition and the vapor deposition mask is difficult. On the other hand, if an electromagnet is used, the alignment between the substrate for vapor deposition and the vapor deposition mask is easy because a magnetic field can be applied after the alignment without applying the magnetic field at the time of the alignment. However, the present inventor has found that if a strong magnetic field is applied using an electromagnet after the alignment of the substrate for vapor deposition and the vapor deposition mask, failure in performance and degradation in properties may occur in the TFTs of the substrate for vapor deposition and in the organic deposition layer of the organic material. In particular, if the hybrid-type vapor deposition mask is used, a strong magnetic field is required for sufficient attraction. In this case, the increase in strength of the magnetic field is at most about twice, and not so much as to require a large electromagnet. However, even in the case of an electromagnet for the conventional metal mask, the magnetic flux changes very significantly when a current thereto is turned on. When the current increases, the magnetic flux changes more significantly. The present inventor has found that the failure in the TFTs formed on the substrate for vapor deposition, and the degradation in the organic layers may occur significantly due to electromagnetic induction generated when the current is turned on.

The present disclosure has been made to solve these problems, and an object of the present disclosure is to provide a vapor deposition apparatus and a vapor deposition method which reduces failure and degradation of elements such as TFTs formed on the substrate for vapor deposition, and which also reduces degradation in properties of the organic layers, even if an electromagnet is used as a magnet in a magnetic chuck.

Another object of the present disclosure is to provide a method of manufacturing an organic EL display apparatus which has excellent display quality, by using the above vapor deposition method.

Means to Solve the Problem

The vapor deposition apparatus according to an embodiment of the present invention comprises: an electromagnet; a substrate holder for holding a substrate for vapor deposition provided in a position facing one magnetic pole of the electromagnet; a vapor deposition mask comprising a magnetic material and provided in a position facing a surface, opposite to the electromagnet, of the substrate for vapor deposition held by the substrate holder; a vapor deposition source placed to face the vapor deposition mask and provided to vaporize or sublimate a vapor deposition material; and a power supply circuit for driving the electromagnet, wherein the electromagnet comprises a first electromagnet for generating a magnetic field in a first orientation, and a second electromagnet for generating a magnetic field in a reverse orientation to the first orientation.

The vapor deposition method according to an embodiment of the present invention comprises the steps of: superposing an electromagnet, a substrate for vapor deposition and a vapor deposition mask comprising a magnetic material on each other, and further attracting the substrate for vapor deposition and the vapor deposition mask to each other by supplying current to the electromagnet from a power supply circuit; and vapor-depositing a vapor deposition material on the substrate for vapor deposition by evaporating the vapor deposition material from a vapor deposition source placed distant from the vapor deposition mask, wherein the electromagnet comprises a first electromagnet for generating a magnetic field in a first orientation, and a second electromagnet for generating a magnetic field in a reverse orientation to the first orientation, in which the second electromagnet is turned off after the current is supplied to the first and second electromagnets at the same time.

The method of manufacturing an organic EL display apparatus according to an embodiment of the present invention comprises: forming at least TFTs and a first electrode on a support substrate; forming an organic deposition layer by vapor-depositing an organic material using the above vapor deposition method; and forming a second electrode on the organic deposition layer.

Effects of the Invention

The vapor deposition apparatus and the vapor deposition method according to an embodiment of the present invention can reduce failure and degradation of elements such as TFTs formed on the substrate for vapor deposition, and reduce degradation in properties of the organic layers.

EMBODIMENT FOR CARRYING OUT THE INVENTION

Figure 1:
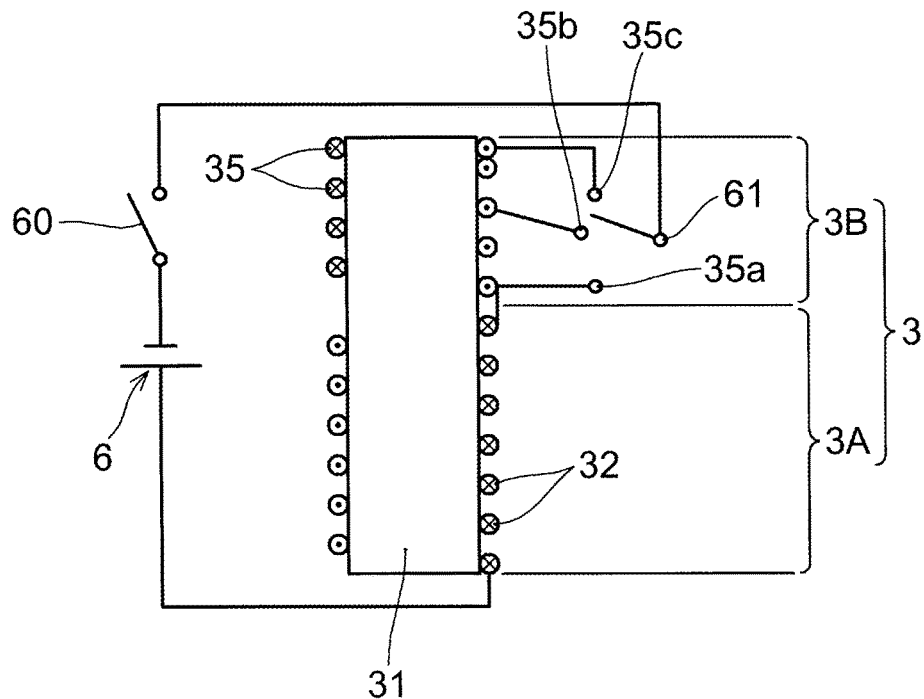
FIG. 1 is a view for explaining an example of configuration of an electromagnet according to an embodiment of the present invention.
Figure 2:
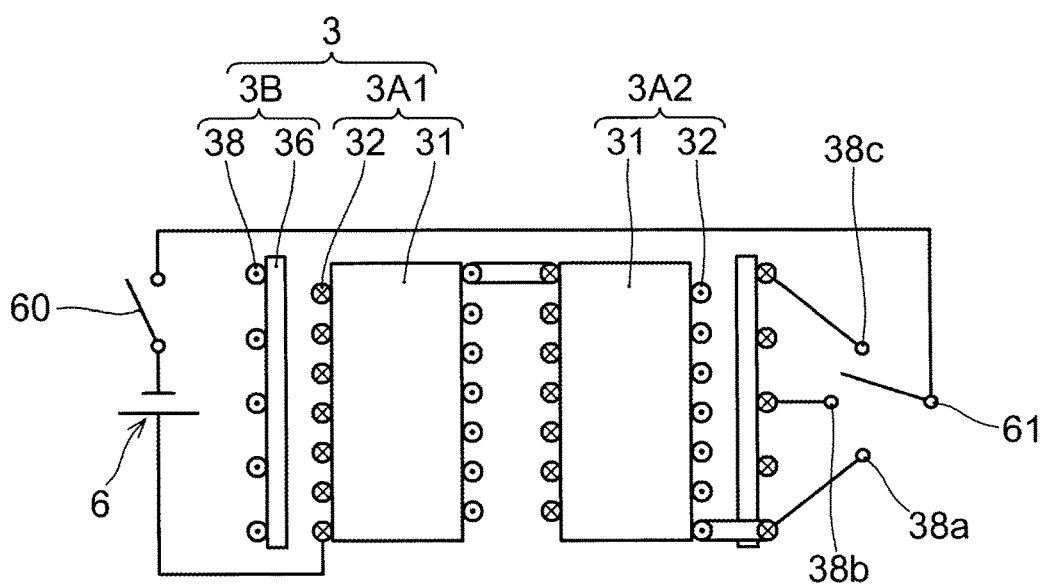
FIG. 2 is a view for explaining another example of configuration of an electromagnet according to the embodiment of the present invention.
Figure 3A:
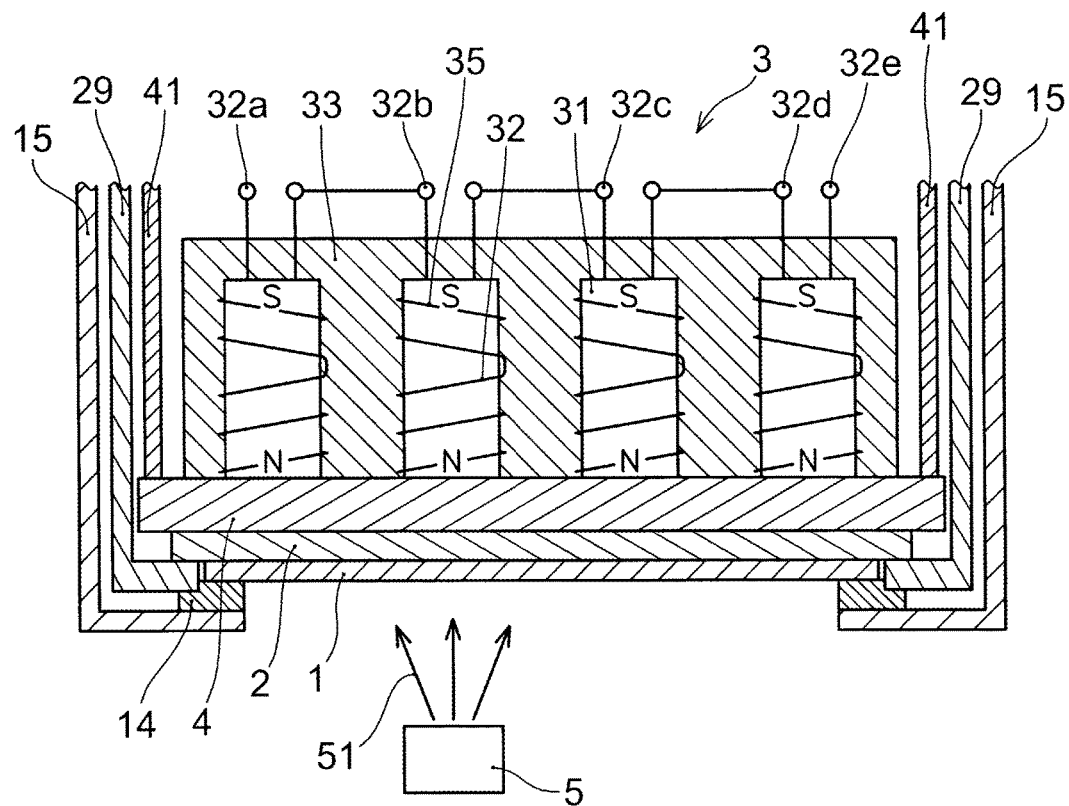
FIG. 3A is a view showing a relationship between an electromagnet, a substrate for vapor deposition and a vapor deposition mask in a vapor deposition apparatus.

Next, referring to the drawings, a vapor deposition apparatus and a vapor deposition method according to an embodiment of the present invention will be described. An example of overall configuration of the vapor deposition apparatus according to the present embodiment is shown in FIG. 3A, and an example of configuration of an electromagnet 3 therein is shown in FIG. 1. As shown in FIG. 3A, the vapor deposition apparatus comprises: the electromagnet 3; a substrate holder 29 for holding a substrate 2 for vapor deposition to be provided in a position facing one magnetic pole of the electromagnet 3; a vapor deposition mask 1 comprising a magnetic material and placed at a surface, opposite to the electromagnet 3, of the substrate 2 for vapor deposition held by the substrate holder 29; and a vapor deposition source 5 placed to face the vapor deposition mask 1 and provided to vaporize or sublimate a vapor deposition material. Further, as shown in FIGS. 1 and 2, the electromagnet 3 comprises: a first electromagnet 3A for generating a magnetic field in a first orientation; and a second electromagnet 3B for generating a magnetic field in a reverse orientation to the first orientation.

Figure 4:
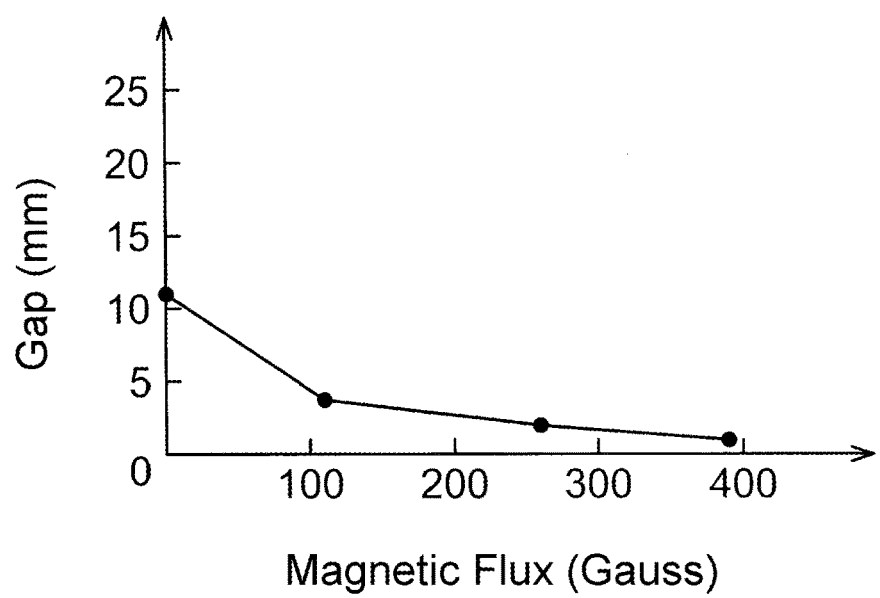
FIG. 4 is a graph showing a relationship between a magnetic flux and a gap between the substrate for vapor deposition and the vapor deposition mask.

Here, in order to obtain a tight contact (good closeness) between the vapor deposition mask 1 and the substrate 2 for vapor deposition, the present inventor investigated the relationship between the magnetic flux and the gap between the vapor deposition mask 1 and the substrate 2 for vapor deposition by using the configuration as shown in FIG. 3A, but using a permanent magnet instead of the electromagnet 3, and by superposing the permanent magnet, the contact plate 4, the substrate 2 for vapor deposition and the vapor deposition mask 1 on each other. FIG. 4 shows the results. Note that the permanent magnet used was a sheet magnet to generate a magnetic field on one side and generate no magnetic field (0 magnetic field) on the other side. Three sheets of permanent magnets with different magnetic fields were prepared, and the relationship between the magnetic field on the surface of the vapor deposition mask 1 and the gap between the substrate 2 for vapor deposition and the vapor deposition mask 1 was investigated by exchanging the three sheets of permanent magnets from one to another. A hybrid-type mask was used as the vapor deposition mask 1. Note that it is known that a gap between the substrate 2 for vapor deposition and the vapor deposition mask 1 is preferably as small as possible, and a desired deposition state of an organic material can be obtained if it is 3 μm or lower, from a result of checking the relationship between the gap and the deposition state.

Thus, from the results of the investigation shown in FIG. 4, it is understood that the magnetic flux density B (B=μH, where μ is permeability and H is strength of magnetic field) is preferably as high as possible. However, as described above, the present inventor has found that if the vapor deposition mask 1 is attracted by a strong magnetic field using the electromagnet 3 to bring the substrate 2 for vapor deposition and the vapor deposition mask 1 sufficiently close to each other, the elements such as TFTs formed on the substrate 2 for vapor deposition may be damaged or degraded in performance, and further the organic layers may be degraded in properties. The present inventor further conducted extensive studies to investigate their causes, and as a result, has found that when a current to an electromagnetic coil (hereafter, may be referred to as first electromagnetic coil) 32 of the electromagnet 3 is turned on, an overcurrent flows in circuits such as TFTs (not shown) formed on the substrate 2 for vapor deposition due to an electromotive force generated by electromagnetic induction. Further, the present inventor has found that the TFTs and the organic layer 25 (refer to FIG. 6) are damaged or degraded due to the overcurrent and Joule heat generated by the overcurrent in an electrode 22 (refer to FIG. 5 or FIG. 6) and so on.

Figure 3B:
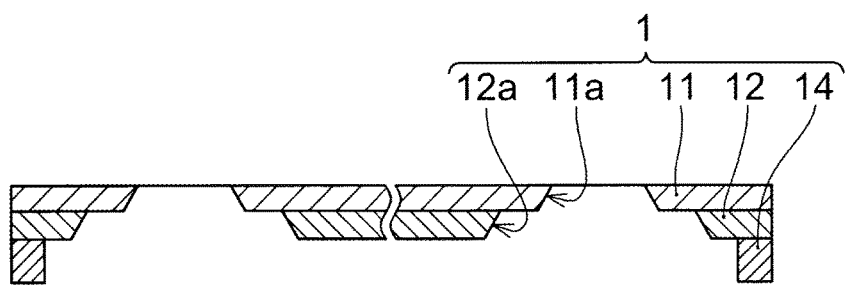
FIG. 3B is an enlarged view of an example of the vapor deposition mask.
Figure 3C:
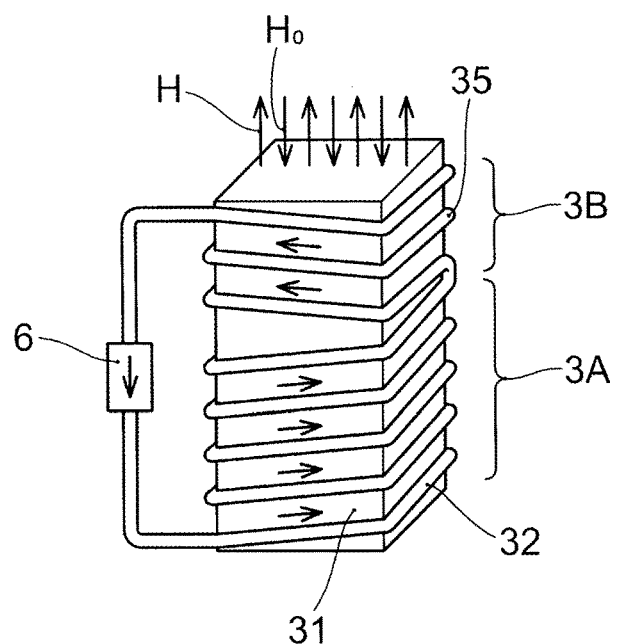
FIG. 3C is a view schematically showing a magnetic field generated by the electromagnet.
Figure 3D:
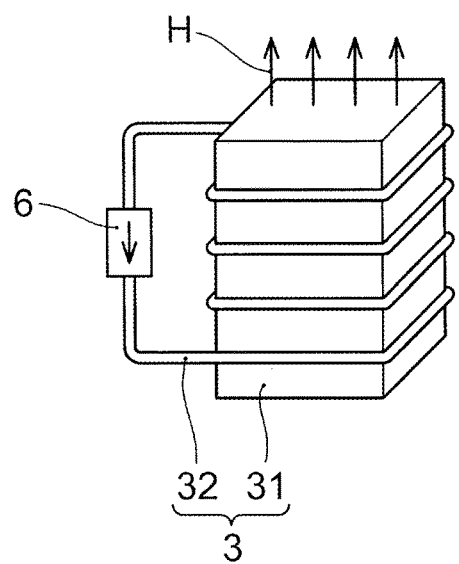
FIG. 3D is a view schematically showing a magnetic field generated by a conventional electromagnet.

More specifically, referring to FIG. 3D which shows an example of a conventional electromagnet 3, a magnetic field H is generated in a certain orientation by the right-handed screw rule when a current is allowed to follow in an electromagnetic coil 32 of the electromagnet 3. This magnetic field H has a property to attract a magnetic material. However, when the current is applied, the current flows quickly (almost instantaneously) and it causes a magnetic flux Φ (Φ=BS=μHS, where S is cross-sectional area of a core 31) generated by the electromagnet 3 to increase quickly. When the magnetic flux Φ varies quickly, an electromotive force V corresponding to V∝−dΦ/dt is generated. When the current to the electromagnetic coil 32 is turned on, a time (rise time) Δt, which is the time from the time 0 of the current, to a predetermined current, though it depends on the magnitude of the self-inductance of the electromagnet 3, and is about 10 μs (microsecond) if the electromagnet 3 is normal. Since Δt is very small, the minute time dt can be approximated by this Δt. Thus, for example, if the magnetic flux is changed by about 300 gauss within this time Δt, it causes an electromotive force of about 30 MV to be generated by electromagnetic induction. This electromotive force causes a current to flow in a closed circuit in the substrate 2 for vapor deposition, thereby causing damage of the TFTs and so on. As can be understood from the above expression, this electromotive force V increases as the change in the magnetic flux Φ increases. Since the electromagnetic coil 32 of the electromagnet 3 has a self-inductance, the change in the magnetic flux Φ is reduced, but nevertheless, a high induced electromotive force of about 30 MV is generated as described above. Such an induced electromotive force causes the damage and the degradation in properties of the elements. In addition, heat as expressed by $Q=V^2 \cdot t/R$ (where R is an electric resistance Ω of the closed circuit in the substrate 2 for vapor deposition) is generated as an amount Q (J) of the Joule heat. This generation of Joule heat may degrade the properties of an organic material which is weak to high temperature.

In addition, the present inventor further conducted extensive studies for investigation, and as a result, has found that by changing a magnetomotive force (N·I where N is the number of turns of the coil, and I is the magnitude of the current to flow in the electromagnetic coil 32) generated by the electromagnet 3 to gradually increase, the generated magnetic flux changes more slowly, and thereby it is possible to solve such a problem. More specifically, the change in the magnetic flux B occurs only when the current to the electromagnetic coil 32 of the electromagnet 3 is turned on or turned off, while if the current is stabilized, a magnetic field corresponding to the current and the number of turns of the coil is stably generated to continuously attract the magnetic material. Thus, the change in the magnetic flux B occurs only when the current is turned on or off, and its time is a time of about 10 μs as described above. If a predetermined current is reached in about 1 ms (millisecond), no problem occurs. Thus, the present inventor has found that the problem due to the generation of electromagnetic induction can be solved by partially reversing the winding orientation of the first electromagnetic coil 32 as shown, for example, in FIG. 3C so as to form the first electromagnet 3A and the second electromagnet 3B which has a winding part wound in a reverse orientation to the first electromagnet 3A, and by turning off the second electromagnet 3B after the current is turned on.

While a predetermined magnetic field H is generated by the first electromagnet 3A, the turning on of the current also causes a current to flow in the second electromagnet 3B. The second electromagnet 3B has a second electromagnetic coil 35 continuous to the electromagnetic coil 32 of the first electromagnet 3A, and therefore, the current flows in them at the same time. However, the winding orientation of the second electromagnetic coil 35 of the second electromagnet 3B is reversed from that of the first electromagnetic coil 32 of the first electromagnet 3A. Thus, the second electromagnet 3B generates a magnetic field H0 which is directed downward in the figure and directed opposite to the magnetic field H of the first electromagnet 3A. As a result, the magnetic field H generated by the first electromagnet 3A is offset, and the magnetic field generated when the current is turned on becomes (H−H0). As described above, the electromotive force generated by electromagnetic induction is proportional to the magnetic flux B, namely the speed of change in the magnetic field H. Therefore, if the magnetic field (H−H0) decreases, the electromotive force generated by electromagnetic induction decreases, and as a result, the influence of the electromagnetic induction is reduced. Thus, the influence of the electromagnetic induction when the current is turned on can be avoided.

For example, if the number of turns of the second electromagnetic coil 35 of the second electromagnet 3B is designed to be about half of that of the first electromagnet 3A, the magnetic field generated when the current is turned on is reduced to about half. This means that the electromotive force generated by electromagnetic induction is also reduced to about half. Further, by turning off the second electromagnet 3B after the current is turned on, an intended magnetic field H to attract the vapor deposition mask 1 can be obtained. Therefore, the attraction of the vapor deposition mask 1 is not influenced at all. It is sufficient if the number of turns of the second electromagnetic coil 35 of the second electromagnet 3B is at most about ⅓ to ⅔ of the number of turns of the electromagnetic coil 32 of the first electromagnet 3A. If reverse electromagnetic induction generated by turning off the second electromagnet 3B causes a problem, multiple terminals can be provided on the second electromagnetic coil 35 of the second electromagnet 3B to turn it off stepwise.

Further, the second electromagnetic coil 35 of the second electromagnet 3B can be wounded not only on extending portion of the core 31 of the first electromagnet 3A as shown in FIG. 3C, but also by providing insulation on an outer periphery of the electromagnetic coil 32 of the first electromagnet 3A to wind it directly thereon, or by changing the first electromagnet 3A to a coreless electromagnet and inserting therein the second electromagnet 3B reversed in the winding orientation, or by preparing a coreless second electromagnet 3B with an inner periphery to insert the first electromagnet 3A therein. Hereinafter, the relationship between the two electromagnets 3A, 3B having different orientations of magnetic fields will be described in further detail.

Example 1

The example shown in FIG. 1, which has a configuration similar to the example shown in FIG. 3, shows an electromagnet 3 in a cross-sectional view in which the orientations of current to the first and second electromagnetic coils 32, 35 are indicated by x (oriented downward) and • (oriented upward). Further, in this example, multiple terminals 35a, 35b, 35c are formed on the second electromagnetic coil 35 of the second electromagnet 3B to make it possible to gradually reduce the second electromagnet 3B by changing over the terminals to be connected. The electric resistances of the first and second electromagnetic coils 32, 35 are very small, and therefore, even if the electromagnetic coil 35 of the second electromagnet 3B is turned off from the voltage of a power supply circuit 6, the remaining current in the first electromagnet 3A hardly changes. Thus, the magnetic field H generated by the first electromagnet 3A can be obtained as it is. On the other hand, when the current is turned on (a main switch 60 is turned on), the second electromagnetic coil 35 also operates. As described above, the electromagnetic coil 32 of the first electromagnet 3A and the second electromagnetic coil 35 of the second electromagnet 3B are continuous to each other, and therefore, the current flows in both of them at the same time. However, since the winding orientation of the second electromagnetic coil 35 is reversed, it generates a reverse magnetic field H0. Therefore, the magnetic field generated when the current is turned on (the main switch 60 is turned on) is reduced, making possible to prevent a bad influence caused by electromagnetic induction.

Note that since the number of turns of the second electromagnetic coil 35 is less than that of the first electromagnetic coil 32 of the first electromagnet 3A, the influence of reverse electromotive force due to electromagnetic induction, which may be generated by turning off the second electromagnet 3B, is small. However, this influence can be made extremely small by turning off the second electromagnet 3B stepwise, if necessary. The stepwise turn-off can be achieved by forming the multiple terminals 35a, 35b, 35c on the second electromagnetic coil 35 as shown in FIG. 1, and sequentially changing over them using a change-over switch 61. The speed of turning off the second electromagnet 3B is not limited in terms of time by short time such as p second, and they can be changed over, for example, by a manually operated slide switch. Speaking of extremes, there is no problem even if it takes a second-scale or minute-scale time. In addition, it is also possible to incorporate a circuit which operates together with the main switch 60 for turning on the current so as to slide the change-over switch 61.

Regarding the turn-off of the second electromagnet 3B, the performance of the second electromagnet 3B can be gradually reduced, for example, by forming the terminals 35a, 35b, 35c as shown in FIG. 1, and by setting the change-over switch 61 to be connected to the terminal 35c when the current is turned on, and further by sliding the change-over switch 61 to allow it to be connected to the terminals 35b, 35a after the current is turned on. The number of terminals is not limited to three, and any number of them can be formed.

It is also possible, for example, to perform an alignment of the substrate 2 for vapor deposition and the vapor deposition mask 1 in a weak magnetic field obtained by operating both of the electromagnets 3A, 3B, and to gradually turn off the second electromagnet 3B after they are set. This makes it possible to perform the alignment in a state where the substrate 2 for vapor deposition and the vapor deposition mask 1 are brought close to each other to some extent, making it easier to perform an accurate alignment. Also, when a magnetic field is applied after the alignment, the magnetic field is gradually applied, making it unlikely to cause a displacement in position between them.

When the first electromagnet 3A is turned off after completion of the vapor deposition, such a configuration to place the second electromagnet 3B side by side with the first electromagnet 3A makes it possible to perform an operation reversed from when the current is turned on, more specifically, to change over the change-over switch 61 of the second electromagnet 3B sequentially from the terminal 35a to the terminal 35c and operate the electromagnet 3B, and thereafter to turn off the main switch 60 of the power supply circuit 6. Thus, even when the substrate 2 for vapor deposition is removed, the magnetic field of the electromagnet 3 can be easily released without being influenced by electromagnetic induction at all. Thus, considering that when the current of the electromagnet 3 is turned off, the same problem of electromagnetic induction as when the current is turned on is likely to occur, the present embodiment can solve this problem as well.

In the example described above, the core 31 is extended to form the second electromagnet 3B. However, as described above, not being limited to the example, it is also possible to wind the second electromagnetic coil 35 on the electromagnetic coil 32 of the first electromagnet 3A into multiple layers, if these coils can be electrically insulated from each other. Further, the second electromagnet 3B can be formed inside or at an outer periphery of the first electromagnet 3A. In any case, it is preferable to connect the electromagnetic coil 32 of the first electromagnet 3A to the second electromagnetic coil 35. This is because the current can be applied to them at the same time.

Example 2

In the example shown in FIG. 1 above, the winding orientation of the first and second magnetic coils 32, 35 wound on the same core 31 is reversed so as to form the first and second electromagnets 3A, 3B. However, it is not necessary to wind two kinds of electromagnetic coils on the same core. For example, as shown in FIG. 2, it is possible to form a first electromagnet 3A (3A1, 3A2) by multiple unit electromagnets 3A1, 3A2, and around a part or the entirety of the first electromagnet, second electromagnet 3B is formed. In this example, a third electromagnetic coil 38 is wound around a housing 36 provided outside the two unit electromagnets 3A1, 3A2 so as to generate a magnetic field in a reverse orientation to that of the first electromagnet 3A. Electromagnetic coils 32 of the first electromagnet 3A1, 3A2 are connected in series, but can also be connected in parallel. However, they are formed by being wound in the same orientation. On the other hand, it is preferable that the third electromagnetic coil 38 of the second electromagnet 3B is wound in a reverse orientation to, and connected in series to, the electromagnetic coils 32 of the first electromagnet 3A. This is because it is necessary to turn on current to them at the same time.

Also in the example shown in FIG. 2, similarly as in FIG. 1, multiple terminals 38a, 38b and 38c are formed on the third electromagnetic coil 38, and their connections are designed to be changed over by a change-over switch 61. Other configurations are the same as those of the example shown in FIG. 1 above, and like elements are denoted by like symbols, the description thereof being omitted.

As shown in FIG. 3A (not showing a power supply circuit 6), a vapor deposition apparatus according to an embodiment of the present invention comprises: an electromagnet 3 placed on a contact plate 4; a substrate holder 29 provided to be able to hold, via the contact plate 4, a substrate 2 for vapor deposition on a surface of the electromagnet 3 corresponding to one magnetic pole thereof; a vapor deposition mask 1 provided on a surface of the substrate 2 for vapor deposition held by the substrate holder 29, which surface is opposite to that facing the electromagnet 3; and a vapor deposition source 5 placed to face the vapor deposition mask 1 and provided to vaporize or sublimate a vapor deposition material. The vapor deposition mask 1 comprises a metal layer (a metal support layer 12: refer to FIG. 3B) made of a magnetic material, and the electromagnet 3 is connected to the power supply circuit 6 (refer to FIGS. 1, 2, 3C) for applying current to electromagnetic coils 32, 35 to attract the metal support layer 12 of the vapor deposition mask 1. The vapor deposition mask 1 is placed on a mask holder 15, while the substrate holder 29 and a support frame 41 for supporting the contact plate 4 are each designed to be able to be lifted up. When the substrate 2 for vapor deposition is carried and placed on the substrate holder 29 by a robot arm (not shown), and the substrate holder 29 is moved down, then the substrate 2 for vapor deposition is brought in contact with the vapor deposition mask 1. Further, when the support frame 41 is moved down, the contact plate 4 is superposed on the substrate 2 for vapor deposition. On top of this, the electromagnet 3 is mounted on the contact plate 4 by operating an electromagnet support member (not shown). Note that the contact plate 4 is provided to flatten the substrate 2 for vapor deposition and cool the substrate 2 for vapor deposition and the vapor deposition mask 1 by circulating cooling water therein (not shown). The material and thickness of the contact plate 4 are determined to homogenize the in-plane magnetic field distribution on a surface of the vapor deposition mask 1.

As shown in the schematic view of FIG. 3C, the electromagnet 3 is formed by winding the first and second electromagnetic coils 32, 35 around a core (magnetic core) 31 made, for example, of an iron core. As described above, the second electromagnetic coil 35 is wound in a reverse orientation to that of the electromagnetic coil 32 of the first electromagnet 3A. FIG. 3A shows a configuration in which the electromagnet 3 is formed by arraying a plurality of unit electromagnets (each individual electromagnet being referred to as unit electromagnet) side by side, the number of which is adapted to the size of the vapor deposition mask 1, in which each of the unit electromagnets is shown in FIG. 3C and has a magnetic core 31 with a cross section of about 5 cm square size, when the vapor deposition mask 1, for example, has a size of about 1.5 m×1.8 m (FIG. 3A being shown on a laterally reduced scale, reducing the number of unit electromagnets). In the example shown in FIG. 3A, the first and second electromagnetic coils 32, 35 wound on each magnetic core 31 are connected in series, and further the plurality of unit electromagnets are connected in series. More specifically, they are connected in series by terminals 32b, 32c, 32d of the unit electromagnets, and terminals 32a, 32e at both ends of the entire block are connected to a power supply (not shown). However, it is also possible to connect the electromagnetic coils 32 of the respective unit electromagnets in parallel. Further, it is possible to connect every several units in series. It is also possible to independently apply current to a portion of the unit electromagnets. However, it is preferable to apply current to the plurality of unit electromagnets at the same time.

As shown in FIG. 3D, when a DC current flows in the electromagnetic coil 32 of the electromagnet 3, a magnetic field H is generated on the basis of the right-handed screw rule. When a magnetic material is placed in the magnetic field H, a magnetism corresponding to the magnitude of the magnetic field H is induced in the magnetic material. As described above, the magnitude of the magnetic field H is determined by the product of N·I, where N is the number of turns of the electromagnetic coil 32, and I is the magnitude of the flowing current. Thus, as the number of turns N of the electromagnetic coil 32 is increased, or the current I is increased, a higher magnetomotive force N·I can be obtained. However, the electromagnetic induction is generated corresponding to the rate of change in N·I, and therefore, a problem occurs if this change is too large, as described above. Thus, the second electromagnet 3B (refer to FIG. 3C) described above is formed to prevent an abrupt change in the magnetic field H.

In the example shown in FIG. 3A, the unit electromagnets are fixed with a resin 33, such as silicone rubber, silicone resin and epoxy resin, provided therearound. This resin 33 is not always necessary, but it can fix the unit electromagnets and facilitate handing the electromagnet 3. However, according to the present embodiment, instead of fixing the unit electromagnets with the resin 33, it is also possible to provide space around them so that the electromagnet 3 can be cooled by thermal radiation, since the electromagnet 3 is used in a vacuum environment. Here, it is preferable that the surface of the electromagnet 3 is a treated surface obtained by a blackening treatment such as alumite treatment. Further, the surface of the electromagnet 3 can be a roughening-treated surface with an arithmetic average roughness Ra of 10 μm or higher, for example. In other words, the surface is preferably subjected to a roughening treatment to obtain a surface roughness Ra of 10 μm or higher. The surface roughness Ra of 10 μm means that the surface area increases 2.18 times, assuming each convex part formed by the roughening is an ideal hemisphere. As a result, the thermal radiation effect also increases twice or more. A cooling device is used to mean a device having a broad sense including the electromagnet 3 having a surface-treated surface formed on the electromagnet 3 as described above, as well as such thermal radiation or water cooling described above. When a large current flows continuously, the electromagnet 3 may generate heat. In this case, it is preferable to cool the electromagnet 3 by water cooling. For example, it is considered possible to bury a water cooling pipe in the resin 33 described above, and allow cooling water to flow therein.

As shown in FIG. 3A, the substrate holder 29 and the mask holder 15 are provided in the vapor deposition apparatus. The substrate holder 29 is connected to a driving device (not shown) to hold, by multiple hook-shaped arms, the substrate 2 for vapor deposition at its peripheral portions so as to allow it to move up and down. With the hook-shaped arms, the substrate holder 29 receives the substrate 2 for vapor deposition having been transferred into a chamber by a robot arm, and moves down until the substrate 2 for vapor deposition gets close to the vapor deposition mask 1. In order to enable the alignment, an imaging device (not shown) is also provided. The contact plate 4 is supported by the support frame 41, and is connected via the support frame 41 to the driving device which moves down the contact plate 4 until it gets in contact with the substrate 2 for vapor deposition. By moving down the contact plate 4, the substrate 2 for vapor deposition is flattened. For the alignment between the vapor deposition mask 1 and the substrate 2 for vapor deposition in the present embodiment, the vapor deposition apparatus also includes a fine movement device to move the substrate 2 for vapor deposition relative to the vapor deposition mask 1 while imaging alignment marks formed on the vapor deposition mask 1 and the substrate 2 for vapor deposition, respectively. In order to prevent the electromagnet 3 from unnecessarily attracting the vapor deposition mask 1, the alignment is performed while the current to the electromagnet 3 is turned off. As described above, according to the present embodiment, both of the first and second electromagnets 3A, 3B are operated when the alignment is performed, so as to enable the alignment with the two being brought close to each other in a weak magnetic field. Note that although not shown, the vapor deposition apparatus also includes a chamber to house the entire shown in FIG. 3A and a device to be evacuated inside the chamber.

As shown in FIG. 3B, the vapor deposition mask 1 includes a resin layer 11, a metal support layer 12 and a frame (frame body) 14 formed around it. For the vapor deposition mask 1, as shown in FIG. 3A, the frame 14 is placed on the mask holder 15. A magnet material is used for the metal support layer 12. As a result, an attraction force acts between the metal support layer 12 of the vapor deposition mask 1 and the magnetic core 31 of the electromagnet 3, and the metal support layer 12 of the vapor deposition mask 1 is attracted by the magnetic core 31 of the electromagnet 3 via the substrate 2 for vapor deposition. Note that the metal support layer 1 can be made of a ferromagnetic material. In this case, the metal support layer 12 is magnetized (a state in which a strong magnetization remains even after removing external magnetic field) by a strong magnetic field of the electromagnet 3. The use of such a ferromagnetic material allows that when separating the electromagnet 3 and the vapor deposition mask 1 from each other, they can be more easily separated by applying a reverse current to the electromagnet 3. According to the present embodiment, even if such a strong magnetic field for magnetization is generated, a trouble due to electromagnetic induction does not occur. Further, it is possible to operate both of the first and second electromagnets 3A, 3B when separating the electromagnet 3 and the vapor deposition mask 1 from each other.

For example, Fe, Co, Ni, Mn or their alloys can be used for the metal support layer 12. Among them, invar (alloy of Fe and Ni) is particularly preferable, because it is only slight different in linear thermal expansion coefficient from the substrate 2 for vapor deposition and it expands very little due to heat. The metal support layer 12 is formed to have a thickness of about 5 µm to 30 µm.

Note that as shown in FIG. 3B, each of an opening 11a of the resin layer 11 and an opening 12a of the metal support layer 12 has a taper shape with a diameter gradually reduced toward the substrate 2 for vapor deposition (refer to FIG. 3A). The reason for this will be described below. Various vapor deposition sources 5 such as point-shaped, linear-shaped surface-shaped ones or the like can be used as the vapor deposition source 5. For example, a line-type vapor deposition source 5 (extending in a direction perpendicular to the sheet in FIG. 3A) formed by linearly arranging melting pots is used for scanning, for example, from the left end to the right end of the sheet, so as to perform vapor deposition on the entire surface of the substrate 2 for vapor deposition. As described above, the vapor deposition source 5 emits the vapor deposition material such that the cross section of the emitted beam of the vapor deposition material as determined by the shape of the melting pot is a sectorial-shaped cross section expanding at a constant angle θ. The opening 12a and the opening 11a of the metal support layer 12 and the resin layer 11, respectively, are formed to have a taper shape so as to allow even the vapor deposition particles near the side of the sectorial cross section shape to reach a predetermined region on the substrate 2 for vapor deposition without being blocked by the metal support layer 12 and the resin layer 11. If the opening 12a of the metal support layer 12 is formed to be large, the taper shape is not required.

Vapor Deposition Method

Next, a vapor deposition method according to an embodiment of the present invention will be described. As shown in FIG. 3A above, the vapor deposition method according to the embodiment of the present invention comprises: a step of superposing an electromagnet 3, a substrate 2 for vapor deposition and a vapor deposition mask 1 comprising a magnetic material on each other, and further attracting the substrate 2 for vapor deposition and the vapor deposition mask 1 to the electromagnet by supplying a current to the electromagnet 3 from a power supply circuit 6 (refer to FIGS. 1 and 2); and a step of depositing a vapor deposition material 51 on the substrate 2 for vapor deposition by evaporating the vapor deposition material 51 from a vapor deposition source 5 placed distant from the vapor deposition mask 1. Further, the electromagnet 3 comprises a first electromagnet 3A for generating a magnetic field in a first orientation, and a second electromagnet 3B for generating a magnetic field in a reverse orientation to the first orientation, while the method is performed by supplying a current to the first and second electromagnets 3A, 3B at the same time, and thereafter turning off the second electromagnet 3B. It is also possible to perform an alignment between the vapor deposition mask 1 and the substrate 2 for vapor deposition before the attraction by the electromagnet 3.

As described above, the substrate 2 for vapor deposition is superposed on the vapor deposition mask 1. The alignment between the substrate 2 for vapor deposition and the vapor deposition mask 1 is performed as follows. It is performed by moving the substrate 2 for vapor deposition relative to the vapor deposition mask 1 while using an imaging device to observe alignment marks for alignment formed on the substrate 2 for vapor deposition and the vapor deposition mask 1, respectively. Here, it can be performed in a weak magnetic field by bringing the substrate 2 for vapor deposition and the vapor deposition mask close to each other, if performed in a state where the first and second electromagnets 3A, 3B are operated at the same time as described above. However, it is also possible to perform the alignment without generating a magnetic field at all. This method can match the opening 11a of the vapor deposition mask 1 with a vapor deposition region (for example, pattern of the first electrode 22 on a device substrate in the case of the organic EL display apparatus described later) on the substrate 2 for vapor deposition. After the alignment, either the second electromagnet 3B is turned off, or the first and second electromagnets 3A, 3B are operated and thereafter the second electromagnet 3B is turned off. If the magnetic flux is stabilized, the magnetic flux is maintained, and almost no electromagnetic induction is generated, making it possible to obtain a stable magnetic field. As a result, a strong attraction force acts between the electromagnet 3 and the vapor deposition mask 1, and thus the substrate 2 for vapor deposition and the vapor deposition mask 1 are brought sufficiently close to each other.

Thereafter, as shown in FIG. 3A, the vapor deposition material 51 is deposited on the substrate 2 for vapor deposition by evaporating (vaporizing or sublimating) the vapor deposition material 51 from the vapor deposition source 5 placed distant from the vapor deposition mask 1. Specifically, a line source formed by linearly arranging melting pots, for example, is used as described above, but it is not limited thereto. For example, when manufacturing an organic EL display apparatus, multiple kinds of the vapor deposition masks 1 which have different opening patterns of the opening 11a formed are prepared, and the vapor deposition masks 1 are exchanged from one to another to perform multiple vapor deposition operations to form organic layers.

According to this vapor deposition method, the magnetic field (magnetic flux) generated by the electromagnet 3 is reduced in an initial period of current application due to the offset between the first electromagnet 3A and the second electromagnet 3B, reducing the electromotive force due to electromagnetic induction. However, when the second electromagnet 3B is turned off, the magnetic field becomes an intended magnetic field to generate a strong attraction force to be able to bring the substrate 2 for vapor deposition and the vapor deposition mask 1 sufficiently close to each other. The second electromagnet 3B can be turned off stepwise instead of at one time. As a result, the overcurrent to flow in the substrate 2 for vapor deposition by electromagnetic induction is reduced, making it possible to reduce an influence on the elements, the organic material and the like formed on the substrate 2 for vapor deposition.

According to the present embodiment, even if the electromagnet 3 is turned off to remove the substrate 2 for vapor deposition after completion of the vapor deposition, a process reversed from when the current is turned on can be performed. More specifically, it is preferable to turn off the electromagnet 3 after operating the second magnet 3B. This can control and reduce electromagnetic induction which is generated because the current changes abruptly from a predetermined value to 0 when the first electromagnet 3A is turned off, and which is reversed from when the current is turned on.

Method of Manufacturing Organic EL Display Apparatus

Next, a method of manufacturing an organic EL display apparatus using the vapor deposition method according to the above embodiment will be described. A known method can be used as the manufacturing method, except for the vapor deposition method. Thus, a method of organic deposition layers using the vapor deposition method of the present embodiment will be described mainly with reference to FIGS. 5 and 6.

The method of manufacturing an organic EL display apparatus according to an embodiment of the present invention comprises the steps of: forming a TFT, a flattening layer (which is not shown) and a first electrode (for example, anode) 22 on a support substrate 21; aligning and superposing a vapor deposition mask 1 on a surface thereof; and forming an organic deposition layer 25 by vapor-depositing a vapor deposition material 51 using the above vapor deposition method. A second electrode 26 (refer to FIG. 6, cathode) is formed on the organic deposition layer 25.

Figure 5:
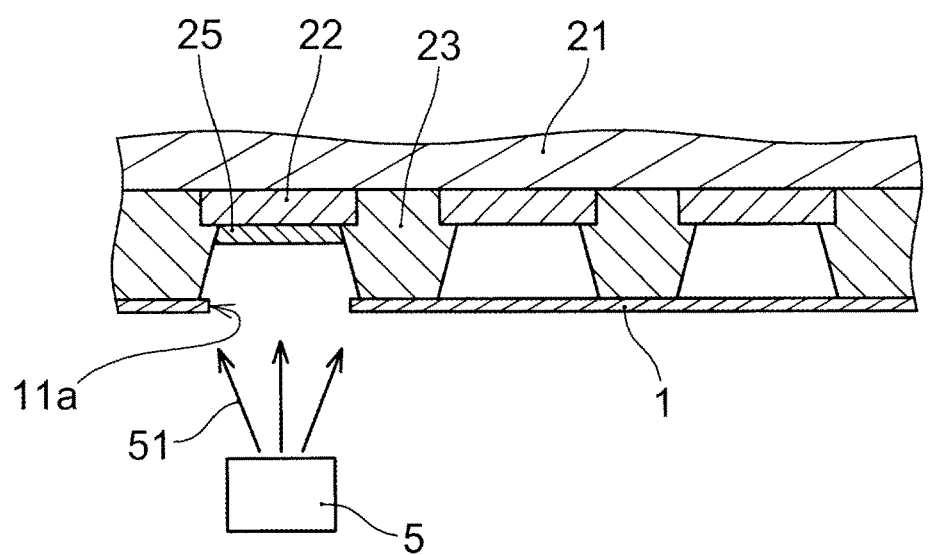
FIG. 5 is a view showing a vapor deposition process based on a method of manufacturing an organic EL display apparatus according to the embodiment of the present invention.
Figure 6:
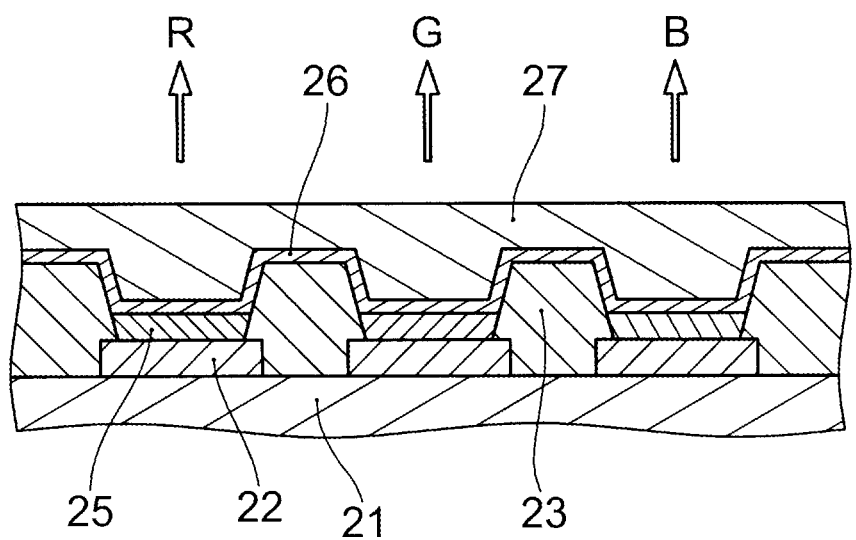
FIG. 6 is a view showing a state in which organic layers are deposited by the method of manufacturing an organic EL display apparatus according to the embodiment of the present invention.

Although not completely shown, driving elements such as TFTs for respective RGB sub-pixels of respective pixels has formed on the support substrate 21, for example, such as a glass plate, while the first electrode 22 connected to the driving elements is formed on the flattening layer by using a combination of a metal layer such as Ag, APC or the like with an ITO layer. As shown in FIGS. 5 and 6, an insulating bank 23 made of $SiO_2$, an acrylic resin, a polyimide resin or the like to divide the sub-pixels is formed between the sub-pixels. The vapor deposition mask 1 described above is aligned and fixed on the insulating bank 23 of the support substrate 21. As shown in FIG. 3A above, this fixing is done by attraction, for example, using an electromagnet 3 provided via a contact plate 4 on the opposite surface of the vapor deposition surface of the support substrate 21. As described above, a magnetic material is used for the metal support layer 12 (refer to FIG. 3B) of the vapor deposition mask 1, and therefore, when a magnetic field is given by the electromagnet 3, the metal support layer 12 of the vapor deposition mask 1 is magnetized to generate an attraction force between it and the magnetic core 31. Even if the electromagnet 3 does not have the magnetic core 31, they are attracted to each other by magnetic field generated by a flowing current in the electromagnetic coil 32. Here, as described above, when the current is turned on, an abrupt change in magnetic flux is prevented by operating the first and second magnets 3A, 3B at the same time. Thus, the influence of electromotive force generated by electromagnetic induction is reduced. Note that the vapor deposition mask 1 has an opening 11a formed narrower than an opening gap on the surface of the insulating bank 23. It achieves to prevent an organic material as much as possible from being deposited on a side wall of the insulating bank 23, thus preventing a reduction in luminous efficiency of the organic EL display apparatus.

In this state, as shown in FIG. 5, a vapor deposition material 51 is evaporated from a vapor deposition source (melting pot) 5 in the vapor deposition apparatus to deposit the vapor deposition material 5 on the support substrate 21 only in an area where the opening 11a of the vapor deposition mask 1 is formed, and thus an organic deposition layer 25 is formed on the first electrode 22 for desired sub-pixels. As described above, the opening 11a of the vapor deposition mask 1 is formed narrower than the opening gap on the surface of the insulating bank 23, and therefore, the vapor deposition material 51 is less likely to be deposited on the side wall of the insulating bank 23. As a result, as shown in FIGS. 5 and 6, the organic deposition layer 25 is deposited almost only on the first electrode 22. This vapor deposition step can also be performed by sequentially exchanging vapor deposition masks 1 for respective sub-pixels. It is also possible to use a vapor deposition mask 1 to deposit the same material for a plurality of sub-pixels at the same time. When the vapor deposition mask 1 is exchanged from one to another, the power supply circuit 6 (refer to FIGS. 1 and 2) is turned off to remove a magnetic field to the metal support layer 12 (refer to FIG. 3B) of the vapor deposition mask 1 by the electromagnet 3 (not shown in FIG. 5A; refer to FIG. 3A). Also here, it is preferable to turn off the power supply circuit 6 after the second electromagnet 3B is operated, so as to make it possible to reduce an influence of electromagnetic induction on the elements such as TFTs formed on the support substrate 21.

FIGS. 5 and 6 show the organic deposition layer 25 as a simple single layer, but the organic deposition layer 25 can be formed of a plurality of layers made of different materials. For example, as a layer to contact the anode 22, a hole injection layer made of a material to match it well in ionization energy to improve hole injection properties may be provided. On the hole injection layer, a hole transport layer to improve stable hole transport and enable electrons confinement (energy barrier) in a light emitting layer is formed by using, for example, an amine group material. Further thereon, a light emitting layer selected depending on the light emission wavelength is formed by doping a red or green organic fluorescent material, for example, for red or green color into Alq3. Further, a DSA group organic material is used as a blue group material. Further, on the light emitting layer, an electron transport layer to improve electron injection properties and stably transport electrons is formed by using Alq3 or the like. These layers are each deposited in a thickness of about a few tens of nm to form the organic deposition layer 25. Note that an electron injection layer such as LiF, Liq or the like to improve electron injection properties may be provided between the organic layers and the metal electrode. The present embodiment refers to these inclusively as the organic deposition layer 25. Although such the organic deposition layer 25 may be influenced by electromagnetic induction, an abrupt change in magnetic field is prevented according to the present embodiment, because, as described above, the second electromagnet 3B to generate a magnetic field in a reverse orientation to that of the first electromagnet 3A is operated when the current is turned on or off. As a result, the influence of electromagnetic induction is reduced.

In the organic deposition layer 25, an organic layer of a material for each of RGB colors is deposited as the light emitting layer. If light emission performance is emphasized, it is preferable to deposit the hole transport layer, the electron transport layer and the like separately by using materials suitable for the light emitting layer. However, considering material cost, the same material may be used for deposition in common for two or three of the RGB colors. If the same material is deposited in common for sub-pixels of two colors or more, the vapor deposition mask 1 is formed to have openings formed for the common sub-pixels. If the vapor deposition layers are different respectively for individual sub-pixels, it is possible to use one vapor deposition mask 1, for example, for R sub-pixels and sequentially vapor-deposit respective organic layers. Further, for depositing a common organic layer for RGB, organic layers for respective sub-pixels are vapor-deposited up to immediately below the common organic layer, and thereafter the common organic layer is deposited by using a vapor deposition mask 1 having openings formed for RGB for all pixels at one time. Note that for mass production, it is also possible to place many chambers of the vapor deposition apparatus side by side which respectively have different vapor deposition masks 1 installed therein, and to move the support substrate 21 (substrate 2 for vapor deposition) through the respective vapor deposition apparatus to sequentially perform vapor deposition.

After the formation of the organic deposition layer 25 formed of all the organic layers including the electron injection layer, such as LiF layer, or the like is completed, the power supply circuit 6 of the electromagnet 3 is turned off, and the electromagnet 3 is separated from the vapor deposition mask 1 as described above. Thereafter, the second electrode (for example, cathode) 26 is formed on its entire surface. Since the example shown in FIG. 6 is a top emission-type device, which is of a type to emit light from its surface opposite to the support substrate 21 as shown in the figure, the second electrode 26 is formed of a transparent material such as a thin Mg—Ag eutectic layer. Otherwise, Al can also be used. Note that in the case of a bottom emission-type device to emit light from the support substrate 21, ITO, $In_3O_4$ or the like is used as the first electrode 22, and a metal with a low work function such as Mg, K, Li, Al or the like is used as the second electrode 26. A protective layer 27 made, for example, of $Si_3N_4$ or the like is formed on a surface of the second electrode 26. Note that its entirety is configured to be sealed by a sealing layer made of glass, resin layer or the like (not shown) to prevent the organic deposition layer 25 from absorbing water. Further, the organic layers can be configured to be made common as much as possible and to have a color filter provided on a front surface thereof.

SUMMARY (1) The vapor deposition apparatus according to a first embodiment of the present invention comprises: an electromagnet; a substrate holder for holding a substrate for vapor deposition provided in a position facing one magnetic pole of the electromagnet; a vapor deposition mask comprising a magnetic material, the vapor deposition mask being provided in a position facing a surface, opposite to the electromagnet, of the substrate for vapor deposition held by the substrate holder; a vapor deposition source placed to face the vapor deposition mask and provided to vaporize or sublimate a vapor deposition material; and a power supply circuit for driving the electromagnet; wherein the electromagnet comprises a first electromagnet for generating a magnetic field in a first orientation, and a second electromagnet for generating a magnetic field in a reverse orientation to the first orientation.

The vapor deposition apparatus according to the first embodiment of the present invention is configured to attract the vapor deposition mask by an electromagnet, and therefore, the alignment between the substrate for vapor deposition and the vapor deposition mask can easily be performed without applying a magnetic field, or in a weak magnetic field. Further, the substrate for vapor deposition sandwiched between the electromagnet and the vapor deposition mask can be brought sufficiently close to the vapor deposition mask. In addition, in the present embodiment, the electromagnet comprises a first electromagnet for generating a magnetic field in a first orientation and a second electromagnet for generating a magnetic field in a second orientation opposite to the first orientation. Therefore, the magnetic field can be weakened by the operation of the second electromagnet when current is turned on. Thus, even when the current to the electromagnet is turned on, it is possible to prevent the elements such as TFTs formed on the substrate for vapor deposition from being influenced by electromagnetic induction generated by the turning on of the current.

(2) The power supply circuit comprises a change-over switch for turning off a current of the second electromagnet after the current is supplied to the first electromagnet and the second electromagnet at the same time. Therefore, it is possible to obtain a desired magnetic field in normal operation, while avoiding an influence of electromagnetic induction, when the current is turned on.

(3) It can also be configured so that a first electromagnetic coil corresponding to the first electromagnet and a second electromagnetic coil corresponding to the second electromagnet are configured to be connected in series, wherein the number of turns of the second electromagnetic coil is less than that of the first electromagnetic coil, and the second electromagnetic coil has a reverse wound orientation to a wound orientation of the first electromagnetic coil. By connecting the two electromagnetic coils in series, it is possible to apply a current to the two electromagnets at the same time. Further, the magnetic field generated by the first magnetic coil is partially offset by the second electromagnetic coil.

(4) It can also be configured so that the second electromagnetic coil comprises terminals at both ends thereof and a third terminal therebetween, wherein the change-over switch turns off the current to the second electromagnet stepwise by changing over the terminals of the second electromagnetic coil. This can avoid an influence of electromagnetic induction which may be generated by turning off the second electromagnet.

(5) It can also be configured so that the first electromagnet is formed by arraying a plurality of unit electromagnets, and the second electromagnet is formed by a third electromagnetic coil wound around the plurality of unit electromagnets. It can be selected depending on the space of the electromagnet.

(6) It can also be configured so that the third electromagnetic coil comprises terminals at both ends thereof and a third terminal therebetween, wherein the change-over switch turns off the current to the second electromagnet stepwise by changing over the terminals of the third electromagnetic coil. This can turn off the second electromagnet stepwise as described above.

(7) The vapor deposition method according to a second embodiment of the present invention comprises the steps of: superposing an electromagnet, a substrate for vapor deposition and a vapor deposition mask comprising a magnetic material on each other, and further attracting the substrate for vapor deposition and the vapor deposition mask to the electromagnet by supplying current to the electromagnet from a power supply circuit; and vapor-depositing a vapor deposition material on the substrate for vapor deposition by evaporating the vapor deposition material from a vapor deposition source placed distant from the vapor deposition mask, wherein the electromagnet comprises a first electromagnet for generating a magnetic field in a first orientation, and a second electromagnet for generating a magnetic field in a reverse orientation to the first orientation, wherein the second electromagnet is turned off after the current is supplied to the first and second electromagnets at the same time.

According to the vapor deposition method of the second embodiment of the present invention, when the current to the electromagnet is turned on, the first electromagnet and the second electromagnet are operated at the same time, and therefore, the magnetic field is reduced, reducing the effect of electromagnetic induction. On the other hand, the second electromagnet is turned off after the current is turned on, and therefore, the magnetic field generated by the first electromagnet is provided as it is, making it possible to obtain a required attraction force. As a result, it is possible to reduce degradation in properties of the elements and the organic layers, while maintaining sufficient attraction between the substrate for vapor deposition and the vapor deposition mask.

(8) By turning off the second electromagnet stepwise, it is possible to reduce the generation of reverse electromagnetic induction when the second electromagnet is turned off.

(9) By operating the second magnet after the vapor deposition of the vapor deposition material is completed, and by thereafter turning off the current to the electromagnet, it is possible to reduce the generation of electromagnetic induction when the current is turned off.

(10) Further, the method of manufacturing an organic EL display apparatus according to a third embodiment of the present invention comprises: forming at least a TFT and a first electrode on a support substrate; forming an organic deposition layer by vapor-depositing an organic material using the vapor deposition method according to any one of the above (7) to (9); and forming a second electrode on the organic deposition layer.

The method of manufacturing an organic EL display apparatus according to the third embodiment of the present invention degradation in properties of the elements and organic layers formed on the support substrate are prevented, when manufacturing the organic EL display apparatus making it possible to obtain a display image with a fine pattern.

DESCRIPTION OF REFERENCE NUMERALS

1 Vapor deposition mask
2 Substrate for vapor deposition
3 Electromagnet
3A First electromagnet
3B Second electromagnet
4 Contact plate
5 Vapor deposition source
6 Power supply circuit
11 Resin layer
11a Opening
12 Metal support layer
12a Opening
14 Frame
15 Mask holder
21 Support substrate
22 First electrode
23 Insulating bank
25 Organic deposition layer
26 Second electrode
27 Protective layer
29 Substrate holder
31 Magnetic core (core)
32 Electromagnetic coil (first electromagnetic coil)
33 Resin
35 Second electromagnetic coil
35a, 35b, 35c Terminal
36 Housing
38 Third electromagnetic coil
38a, 38b, 38c Terminal
41 Support frame
51 Vapor deposition material
60 Main switch
61 Change-over switch

The invention claimed is:

1. A vapor deposition method comprising the steps of:
   superposing an electromagnet, a substrate for vapor deposition and a vapor deposition mask comprising a magnetic material on each other, and further attracting the substrate for vapor deposition and the vapor deposition mask to the electromagnet by supplying current to the electromagnet from a power supply circuit; and
   vapor-depositing a vapor deposition material on the substrate for vapor deposition by evaporating the vapor deposition material from a vapor deposition source placed distant from the vapor deposition mask,
   wherein the electromagnet comprises a first electromagnet for generating a magnetic field in a first orientation, and a second electromagnet for generating a magnetic field in a reverse orientation to the first orientation,
   wherein the second electromagnet is turned off after the current is supplied to the first and second electromagnets at the same time.

2. The vapor deposition method according to claim 1, wherein the second electromagnet is turned off stepwise.

3. The vapor deposition method according to claim 1, wherein after the vapor deposition of the vapor deposition material is completed, the second electromagnet is operated, and thereafter the current to the electromagnet is turned off.

4. A method of manufacturing an organic EL display apparatus comprising:
   forming at least a TFT and a first electrode on a support substrate;
   forming an organic deposition layer by vapor-depositing an organic material using the vapor deposition method according to claim 1; and
   forming a second electrode on the organic deposition layer.

* * * * *